(12) United States Patent
Ishikawa et al.

(10) Patent No.: US 6,606,174 B1
(45) Date of Patent: Aug. 12, 2003

(54) OPTICAL SEMICONDUCTOR DEVICE

(75) Inventors: Tsutomu Ishikawa, Osaka (JP); Satoru Sekiguchi, Osaka (JP); Hiroshi Kobori, Osaka (JP); Kiyokazu Kamado, Osaka (JP); Hideo Kunio, Osaka (JP); Isao Ochiai, Osaka (JP); Kiyoshi Takada, Osaka (JP); Hiroshi Inoguchi, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/409,039

(22) Filed: Sep. 29, 1999

(30) Foreign Application Priority Data

Sep. 30, 1998 (JP) .............................................. 10-278000
Oct. 30, 1998 (JP) .............................................. 10-309865

(51) Int. Cl.[7] .............................................. H04B 10/00
(52) U.S. Cl. ...................... 359/152; 359/189; 359/180; 359/109; 359/142; 359/143; 359/147; 359/154
(58) Field of Search ................................ 359/189, 180, 359/109, 127, 128, 117, 142, 143, 147, 152, 154

(56) References Cited

U.S. PATENT DOCUMENTS

| | | | | |
|---|---|---|---|---|
| 5,200,628 A | * | 4/1993 | Ikeda et al. ................. | 250/574 |
| 5,894,362 A | * | 4/1999 | Onaka et al. ................ | 359/110 |
| 6,348,985 B1 | * | 2/2002 | Jiang et al. ................. | 359/119 |
| 2001/0019530 A1 | * | 9/2001 | Saitoh et al. ................ | 369/121 |
| 2001/0048540 A1 | * | 12/2001 | Konishi ....................... | 359/180 |
| 2002/0061035 A1 | * | 5/2002 | Tokita et al. ................. | 372/26 |
| 2002/0105433 A1 | * | 8/2002 | Satoh ......................... | 340/825.5 |

FOREIGN PATENT DOCUMENTS

| | | |
|---|---|---|
| JP | 7-28085 | 8/1987 |
| JP | 10-70304 | 3/1998 |

* cited by examiner

*Primary Examiner*—Nina Tong
(74) *Attorney, Agent, or Firm*—Fish & Richardson P.C.

(57) ABSTRACT

In a data transmission, a driving circuit 14 drives a light receiving element 15 in accordance with data from an external control circuit. In accordance with IrDA or remote control communication, driving capability of the driving circuit is changed. In a data reception, received data is transferred to a first or a second signal processing circuit in accordance with the IrDA or remote control communication and processed according to each communication format. In this configuration, a single light emitting or light receiving element permits data communication in different kinds of data communication formats.

12 Claims, 5 Drawing Sheets

OPTICAL SEMICONDUCTOR DEVICE

BACKGROUND OF THE INVENTION

1. Field of the Invention

The present invention relates to an optical semiconductor device suited to two or more communication formats.

2. Description of the Related Art

In recent years, multimedia appliances such as a "sub-note personal computer", a portable information terminal, an electronic still camera, etc. have advanced remarkably.

Further, seven millions appliances are sold in a year, and their about 80% adopt an infrared ray system under the IrDA (Infrared Data Association) standard. Therefore, they require transmission/reception between their body and an external system through infrared ray signals. In order to implement such transmission/reception, a light emitting element for emitting infrared rays and a light-receiving element for receiving the infrared rays become necessary.

The optical head used in an optical recording/reproducing apparatus detects a modulated beam emitted from an optical recording medium when it is irradiated with light beams, thereby carrying out recording/reproducing of information. In such a technical field of application also, the light emitting element and the light emitting element are required.

However, compactness of these light-emitting element and light receiving element have not been yet realized. A semiconductor device (module) as shown in FIG. 5 has been proposed in Japanese Patent Publication. No. 7-28085 in which a semiconductor laser 1 is directly connected to a semiconductor substrate 2 and a prism having a trapezoidal shape in section is secured to the semiconductor substrate 2. Reference numeral 4 denotes an optical recording medium.

A slanted face 5 of the prism 3 opposite to the semiconductor laser 1 is a semi-transparent reflection face. The area of a prism face 6 abutting on the semiconductor substrate 2, other than that of an optical detector (light receiving element) 7 is a reflecting face. A prism face 8 opposite to the prism face 6 is also the reflecting face.

A light beam 9 is emitted from the semiconductor laser 1 and incident on the prism 3 through the slanted face 5. The light beam 9 is reflected by the reflecting faces 6 and 8 and detected by the optical detector 7.

On the other hand, an infrared ray data communication module which is a typical conventional optical semiconductor device as shown in FIG. 6 has been proposed in JP-A-10-70304. It is a module M incorporating an infrared ray LED, an LED driver, a PIN photodiode, an amplifier, etc. For example, the LED is mounted on a substrate formed in the module. The light emitted from the LED is externally emitted through a lens L1 attached on the upper face of the module M. The photodiode is also mounted on the substrate. The light from the photodiode is incident on the module M through a lens L2 attached to the upper face of the module M. Such a module is mounted on a printed board equipped with an optional circuit. These modules have the following defects. The module shown in FIG. 5, in which an optical device is mounted on the semiconductor substrate, requires a very sophisticated technique to manufacture and is very expensive. The module shown in FIG. 6 requires for light to be taken in/out from above the module, and hence another optical semiconductor to be located. The system incorporating these components increases its thickness and hence cannot be miniaturized.

Meanwhile, the various appliances described above use the remote control standard as an infrared ray day communication system instead of the above IrDA. In the IrDA and remote control, the wavelength of the infrared rays used in each of the appliances varies according to the standard. The wavelength is 950 nm in the IrDA standard, and 870 nm in the remote control standard. Because of such a difference in wavelength, conventionally, LEDs having different wavelengths were used individually. Therefore, in the appliance using both IrDA and remote control standards, the number of IC's to be used increases. This hinders such an appliance from being miniaturized.

Further, the outer shape of the module also hinders realization of the compactness. Specifically, in the modules as shown in FIGS. 5 and 6, the optical device is mounted on the semiconductor substrate, and the lens is mounted on the module with the semiconductor substrate molded. Therefore, the set incorporating these modules cannot be miniaturized.

Further, in the module shown in FIG. 6, in which the lens is attached to the upper face of the module, light cannot be taken in or out in only a direction perpendicular to a printed board. Therefore, when the module is built in the above appliance, the printed board must be grounded perpendicularly to the direction of taking in or out light. This also hinders the compactness of the appliance from being realized. In a low-profiled portable appliance, it is difficult to take out or in light from the side wall of the appliance. The present invention has been accomplished in order to solve the above problems described above.

SUMMARY OF THE INVENTION

An object of the present invention is to provide an optical semiconductor device which can transmit or receive signals in a plurality of different communication formats, can be easily manufactured to provide its compactness and low-profiling.

In order to attain the above object, in accordance with a first aspect of the present invention, there is provided an optical semiconductor device capable of receiving data in a first and a second communication format which are different from each other, comprising: a light receiving element for receiving input data in the first and the second communication format; a first signal processing circuit for processing an output signal from the light receiving element when input data in the first communication format is received; and a second signal processing circuit for processing the output signal from the light receiving element when input data in the second communication format is received.

Preferably, the first signal processing circuit includes a signal transferring means processing the output signal from the light receiving element and transferring a wave-shaped signal to a rear stage circuit.

Preferably, the second signal processing circuit includes a detecting means for detecting an output signal from the light receiving element and a signal transferring means transferring an output signal from the detecting means.

Preferably, the first communication format is an IrDA communication and the second communication format is a remote control communication.

Preferably, the optical semiconductor device comprises a first semiconductor chip in the light receiving element, the first and the second signal processing circuit are integrated on the same semiconductor substrate; a resin sealing body which seals the first semiconductor chip with a light receiving face of the light receiving element oriented upward and is transparent to a prescribed wavelength of light; and a light reflecting face formed on the resin sealing body on the first semiconductor chip and crossing a normal line to the light receiving face at a prescribed angle, wherein a side wall of the resin sealing body serves as a light receiving face.

Preferably, the optical semiconductor device further comprises: a light emitting element for emitting light having a prescribed wavelength in order to transmit data in the first and the second communication format which are different from each other; and a driving circuit which is changed in its driving capability according to the communication format and is adapted to drive the light emitting element according to the input data.

Preferably, the driving circuit is designed so that the driving capability is low in the IrDA communication and is high in the remote control communication.

Preferably, the optical semiconductor device further comprises a second semiconductor chip on which the light emitting element is integrated, the second semiconductor chip being integrally resin-sealed on the resin sealing body so that the reflecting face crosses a normal line to the light emitting element at a prescribed angle, and the side wall of the resin sealing body serves as a light emitting face.

Preferably, the driving circuit is integrated on the first semiconductor chip.

In accordance with the second aspect of the present invention, there is provided an optical semiconductor device capable of receiving data in a first and a second communication format which are different from each other, comprising: a light emitting element for emitting light having a prescribed wavelength; a driving circuit which is changed in its driving capability according to the communication format and is adapted to drive the light emitting element according to the data.

Preferably, the wavelength of the light corresponds to one of the communication formats.

Preferably, the driving circuit includes a plurality of driving transistors corresponding to the communication formats, resistors connected to emitters of the driving transistors, respectively to determine values of driving currents from the driving transistors; and a switching means for selecting one of the driving transistors according to the communication format.

Preferably, at least one of the resistors is an external resistor.

Preferably, the first communication format is an IrDA communication and the second communication format is a remote control communication.

Preferably, the driving circuit is designed so that the driving capability is low in the IrDA communication and is high in the remote control communication.

Preferably, the optical semiconductor device comprises: a second semiconductor chip on which the light emitting element is integrated on a semiconductor substrate; a resin sealing body for sealing the second semiconductor chip with a light emitting face of the light emitting element oriented upward and is transparent to a prescribed wavelength of light; and a light reflecting face formed on the resin sealing body on the second semiconductor chip and crossing a normal line to the light emitting face at a prescribed angle, wherein a side wall of the resin sealing body serves as a light emitting face.

Preferably, the driving circuit is integrated on a first semiconductor chip which is different from the second semiconductor chip on which the light emitting element is mounted and sealed integrally to the resin sealing body.

In accordance with the third aspect of the present invention, there is provided an optical semiconductor device according to the first aspect, comprising: a first semiconductor chip on which a light emitting element with its upper face oriented upward is mounted; a second semiconductor chip on which the light receiving element with a light receiving element oriented upward, the first and the second signal processing circuit for processing an output signal from the light receiving element and a driving circuit for driving the light emitting element are integrated on the same semiconductor substrate; a resin sealing body which seals the first and the second semiconductor chip with the light receiving and emitting faces oriented upward and is transparent to a prescribed wavelength of light; and a light reflecting face formed on the resin sealing body on the first and the second semiconductor chip and crossing a normal line to the light receiving and emitting faces at a prescribed angle, wherein a side wall of the resin sealing body serves as a light receiving or emitting face.

Preferably, the first and the second semiconductor chip are integrally sealed within the resin sealing body.

Preferably, the first and the second semiconductor chip are sealed in a first and a second resin sealing body, respectively.

Preferably, the signal processing circuit is a current/voltage converting circuit for converting an output current from the light receiving element into a voltage.

The present invention provides an optical semiconductor device capable of transmitting or receiving signals in a plurality of communication formats which are different from one another. In the configurations described above, the present invention realizes its miniaturizing and low-profiling at low cost. The optical semiconductor device according to the present invention includes signal processing circuits capable of processing received data in two different communication formats and/or a driving circuit for driving the light emitting element so as to emit light, and comprises a semiconductor chip on which the light receiving element and/or light emitting element, a sealing body which seals the semiconductor chip and is arranged to provide a reflecting face with a prescribed angle from the light emitting face or light receiving face so that an optical passage of incident light or emitting light is bent through the reflecting face. Such a configuration contributes to miniaturization and low-profiling of the optical semiconductor device.

Particularly, incidence and emission of light can be made from the side wall of the sealing body through the reflecting face, thereby further facilitating the low-profiling. By providing the sealing body with a means having a reflecting face separately or integrally, with the optical semiconductor device located horizontally, the incident light or emitting light is made horizontal. Thus, the positioning accuracy of the optical passage of light is improved. Further, if these optical semiconductor devices are located at opposite positions, optical communication can be made in a horizontal direction.

Since light can be emitted from the upper face of the sealing body through the reflecting face, if the sealing body is provided with the means having a reflecting face separately or integrally, with the optical semiconductor device located horizontally, the incident light or emitting light is made vertical. This greatly contributes to cost reduction.

In accordance with the present invention, since a single pair of light emitting element and light receiving element can transmit/receive various kinds of infrared rays data, the number of components in the appliance can be reduced. This greatly contributes to miniaturizing and low-profiling of a set of devices constituting an appliance.

Since the groove is formed in the resin sealing body so that it provides the reflecting face, light is emitted from the side of the resin sealing body. Therefore, the optical semiconductor device can be miniaturized and low-profiled, thereby permitting the set appliance using such an optical semiconductor device to be miniaturized and low-profiled.

The above and other objects and features of the present invention will be more apparent from the following description taken in conjunction with the accompanying drawings.

OF THE PREFERRED EMBODIMENTS

Figure 1:
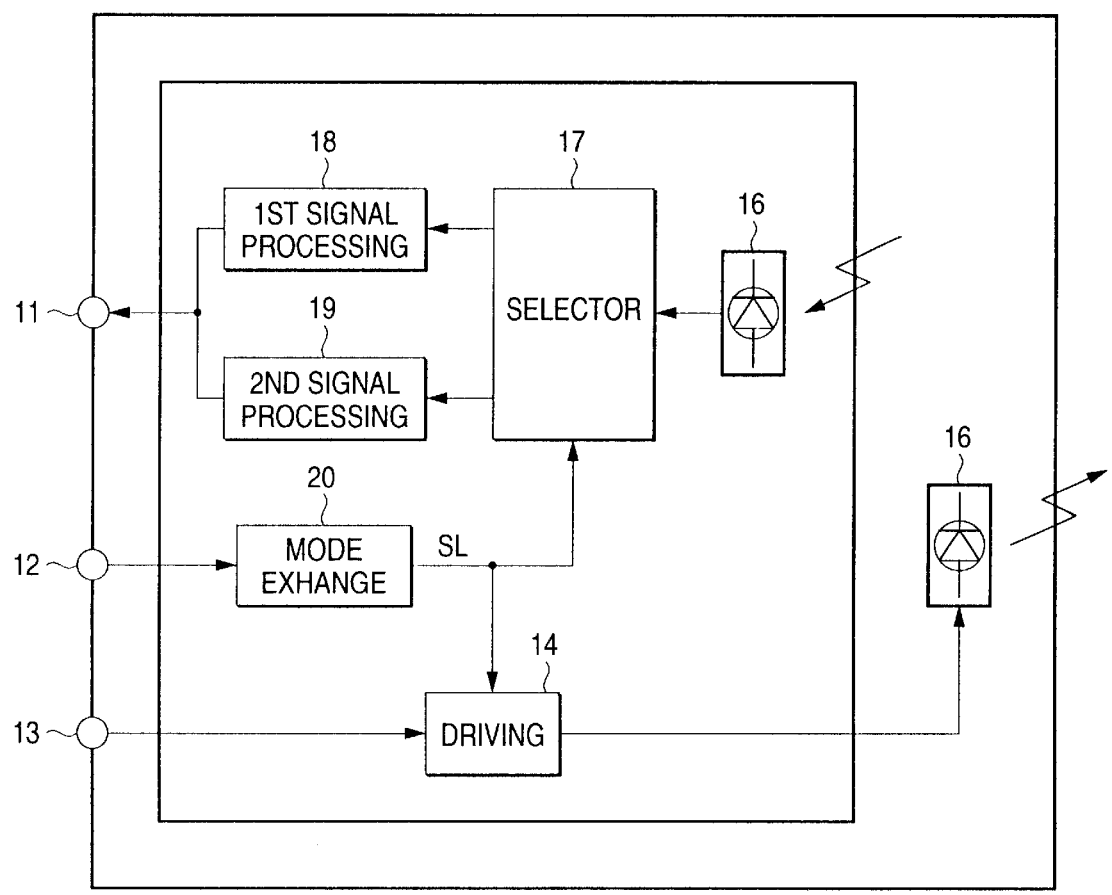
FIG. 1 is a block diagram showing an embodiment of the present invention.

The optical module according to an embodiment of the present invention permits data in both IrDA and remote control standards to be transmitted/received. As seen from FIGS. 1 to 3 which are equivalent circuits and FIGS. 4A and 4B which are a plan view and a sectional view, the optical module according to this embodiment is structured so that a first semiconductor chip 53 and a second semiconductor chip 54 are integrally molded by a transparent resin sealing body 60. The first semiconductor chip 53 includes a light receiving element 16, a signal processing circuit 19 which processes the signal received by the light receiving element 16 in accordance with various communication formats and a driving circuit 14 for driving a light emitting element. A groove 62 is formed on the upper surface of the resin sealing body 60 so that incidence or emission of light from the side of the sealing body can be made through a wall surface 61 of the groove 62 serving as a reflecting face. Such a structure permits the module according to this embodiment to be low-profiled greatly. Reference numerals 11–13 denote external pins through which data are transmitted to or from an external control circuit (not shown) such as a microcomputer. Reference numeral 14 denotes a driving circuit for generating driving signals in accordance with two kinds of data from the external control circuit. Reference numeral 15 denotes a light emitting element such as an LED which emits light according to the driving signal. Reference numeral 16 denotes a light receiving element such as a photo-diode. Reference numeral 17 denotes a selector for dividing the data transfer passage from the light receiving element 17 into two flow data transfer passages at the rear stage. Reference numeral 18 and 19 denote a first and a second signal processing circuit for processing the data signals from the selector 17 according to their kinds. Reference numeral 20 denotes a mode exchanging circuit for generating a selector signal which serves to control the driving capability of the driving circuit 14 and selector 17 in accordance with an instruction from the external control circuit in the IrDA communication or remote control communication. Incidentally, in FIG. 1, the circuits other than the light emitting element 15 are integrated on the same semiconductor substrate, and all the circuits are packaged integrally in a single resin sealing body.

The light emitting element 15 shown in FIG. 1 is used for the IrDA communication, and may be an LED with a wavelength of 950 nm. Also, in the case where the data for remote control is transferred, the light emitting element 15 is caused to emit light for the data transfer. Therefore, the light emitting element 15 is used for both the IrDA communication and remote control communication. A light receiving element 16 is also used for both IrDA communication and remote control communication and receives infrared rays for the IrDa and remote control communications.

First, in the case of the IrDA communication, a mode exchanging circuit 20 receives a mode signal of e.g. two bits "100", from the external control circuit to generate a selector signal SL at "H" level. In accordance with the selector signal SL, a driving circuit 14 reduces a driving capability. Thus, the selector 17 applies an output signal from the light receiving element 16 to a first signal processing circuit 18 which is a processing circuit for the IrDA communication. By exchanging the driving current of the driving circuit 14 into "large" or "small", the driving capability of the driving circuit 14 is exchanged. If the driving current is large, the driving capability increases. If the driving current is small, the driving capability decreases.

In this state, where data should be transmitted, the data for the IrDA communication is supplied to the driving circuit 14 through an external pin 13 through the external control circuit. The driving circuit 14 generates a driving signal according to the data for the IrDA communication. In response to the driving signal, the light emitting element 15 emits light so that the data for the IrDA communication is transmitted as infrared rays.

Where the data for IrDA should be received, the light received by the light receiving element 16 is converted into an electric signal. The electric signal is applied to the first signal processing circuit 18 through the selector 17 and processed for IrDA. The signal thus processed is transferred to the external control circuit through the external pin 11.

On the other hand, in the case of the remote control communication, a mode exchanging circuit 20 receives a mode signal M of e.g. two bits "11" from the external control circuit to generate a selector signal SL at "L" level. In accordance with the selector signal SL, a driving circuit 14 increases a driving capability. Thus, the selector 17 applies an output signal from the light receiving element 16 to a second signal processing circuit 20 which is a processing circuit for the remote control communication.

In this state, where data should be transmitted, the data for the remote control communication is supplied to the driving circuit 14 through the external pin 13 through the external control circuit. The driving circuit 14 generates a driving signal according to the data for the remote control communication. In response to the driving signal, the light emitting element 15 emits light so that the data for the remote control communication is transmitted as infrared rays. Now, the driving capability of the driving circuit 14 during the remote control communication is set higher than during the IrDA communication. Generally, in the IrDA communication, data transfer is made at the distance of 1 meter or shorter between appliances on the otherhand, in the remote control communication, the data transfer is made at the distance of 1 meter or longer between appliances. Therefore, during the remote control communication, the above driving capability is enhanced to increase the light emitting power of the light emitting element 15, thus permitting the remote control communication at a long distance. During the IrDA communication which does not require the communication at the long distance, the light emitting power is reduced to suppress power consumption.

Where the data for remote control should be received, the light received by the light receiving element 16 is converted into an electric signal. The electric signal is applied to the second signal processing circuit 19 through the selector 17 and processed for the remote control. The signal thus processed is transferred to the external control circuit through the external pin 11.

In FIG. 1,the data for remote control is transferred using the infrared rays (wavelength : 9500 nm) for IrDA. This can be implemented because the wavelengths for the IrDA and remote control are proximate to each other. Further, the frequency characteristic of the second signal processing circuit 19 is set taking the wavelength of the infrared rays in IrDA into consideration, thereby permitting correct signal processing. In contrast to the case of FIG. 1, as the light emitting element 15, an LED for remote control which can generate the infrared rays at 870 nm may be used, thereby permitting the data for IrDA to be transferred by the infrared rays for remote control.

Figure 2:
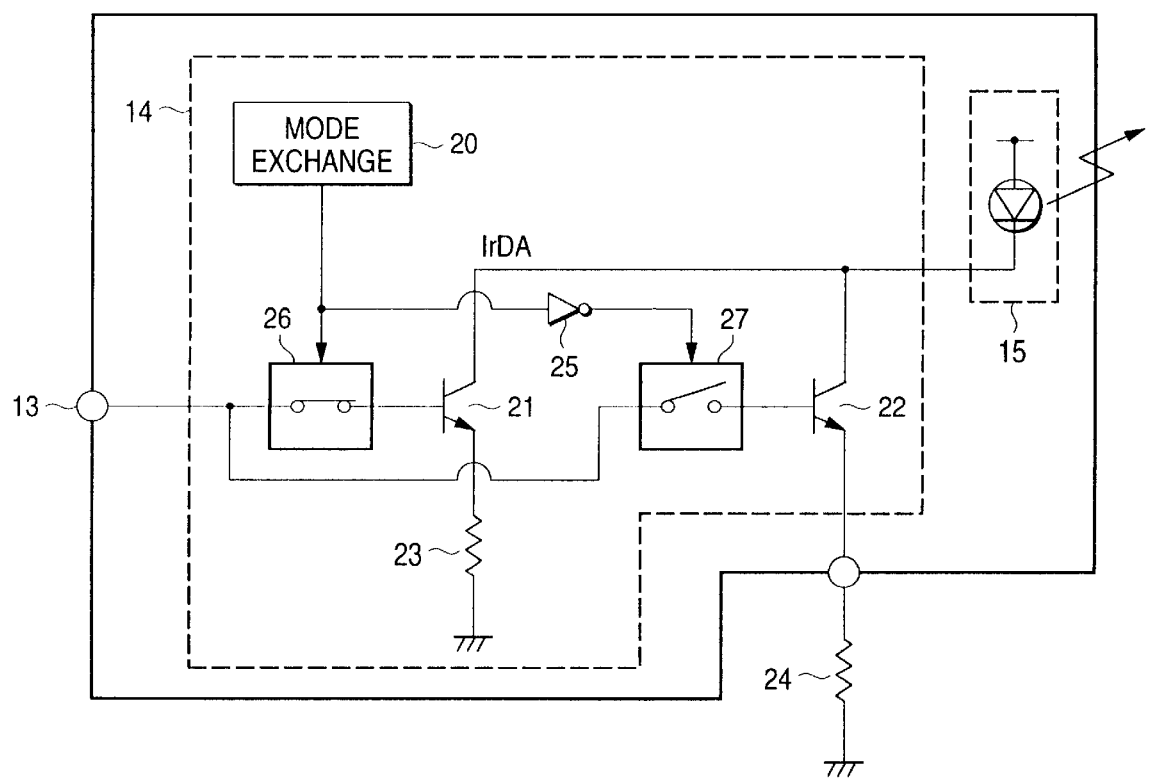
FIG. 2 is a circuit diagram showing a typical circuit of a driving circuit 14 in FIG. 4.

FIG. 2 is a circuit diagram showing a typical concrete example of the driving circuit 14. In FIG. 2, reference numeral 21 denotes a driving transistor for IrDA; 22 a driving transistor for remote control; 23 a resistor which-:serves to determine the driving current of the driving transistor 21 and is integrated on the same semiconductor substrate as the driving circuit 14; 24 an external resistor which serves to determine the driving current of the driving transistor 22; 25 an inverter for inverting a select signal SL; and 26, 27 a switch which turns on only when the selector signal is at "H" level so as to interrupt or conduct the data from the external control circuit.

In the IrDA communication, the selector signal SL is at "H" level so that the switch 26 is "on" and the switch 27 is "off". Thus, the data inputted through the external pin 13 is applied to the driving transistor 21 to generate the driving current corresponding to the input data. The driving current is supplied to the light emitting element 15 so that the light emitting element is driven.

In the remote control communication, the selector signal SL is at "L" level so that the switch 26 is "off" and the switch 27 is "on". Thus, the input data is applied to the driving transistor 22 to generate the driving current corresponding to the input data. The driving current is supplied to the light emitting element 15 so that the light emitting element 15 is driven.

Now, when the voltage reduced from the voltage of the input data by the base-emitter voltage $V_{BE}$ of the transistor 21 is applied to the resistor 23, the driving transistor 21 generates a driving current. Therefore, the driving current of the driving transistor 21 depends on the resistance of the resistor 22. Likewise, the driving transistor 22 generates the driving current so that its driving current depends on the resistance value of the external resistor 24. In the present invention, the driving capability of the driving circuit is set higher in the remote control communication than in the IrDA communication. Therefore, the resistance of the external resistor 24 is set at a smaller value than that of the resistor 23.

Additionally, the remote control communication is carried out in various communication distances according to environments to be used. To this end, the resistor 24 is externally attached to adjust the communication distance according to the environment.

Figure 3:
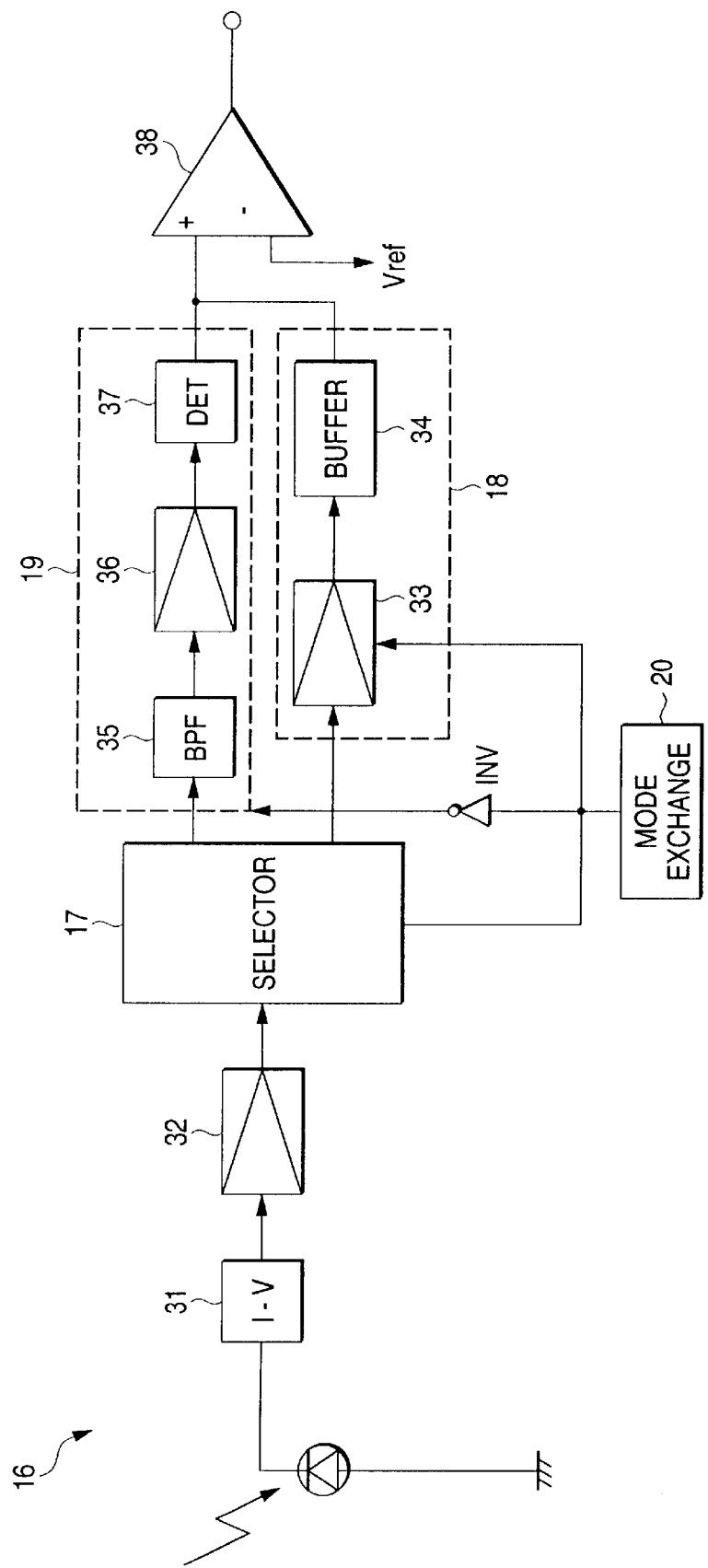
FIG. 3 is a block diagram showing a circuit on the receiving side in FIG. 1.

FIG. 3 is a block diagram showing an concrete configuration of the light emitting element 16, and first and second signal processing circuits 18 and 19. The light receiving element 16 includes a photodiode, an I–V converting circuit 31 for converting the output current of the photodiode into a voltage and an amplifier 32 for amplifying the output voltage from the I–V converting circuit 31. The first signal processing circuit 18 includes an amplifier 33 for amplifying the output signal from the selector 17 and a buffer circuit 34 to which the output signal from the amplifier 33 is applied. The second signal processing circuit 19 includes a BPF (band-pass :filter) for limiting the output signal from the selector 17 to the frequency band of a carrier signal, an amplifier 36 for amplifying the output signal from the BPF 35 and a detector 37 for detecting the output signal from the amplifier 37. A wave shaping circuit 38 is provided for wave-shaping one of the outputs from the first and second signal processing circuits 18 and 19.

In operation of the arrangement of FIG. 3, the selector signal is exchanged according to the IrDA communication or remote control communication. In the IrDA communication, the selector signal SL at the H level is generated. Therefore, the selector 17 is exchanged to the side of the first signal processing circuit 18 so that the first signal processing circuit 18 turns on and the second signal processing circuit 19 turns off. In the remote control communication, the selector signal SL at the L level is generated. Therefore, the selector 17 is exchanged to the side of the second signal processing circuit 19 so that the first signal processing circuit 18 turns off and the second signal processing circuit 19 turns on.

In operation of the arrangement of FIG. 3, in the case of the IrDA communication, the output signal from the I–V converting circuit 31 is amplified by the amplifier 32 and further amplified by the amplifier 33. The output signal from the amplifier 33 is applied to the wave-shaping circuit 38 through the buffer circuit 34 so that its waveform is shaped. The output signal from the wave-shaping circuit 18 is transferred to a rear stage external control circuit. In the IrDA communication, the data based on the received infrared rays is converted into an electric signal which is in turn wave-shaped, and the signal thus obtained is transferred to the rear stage circuit.

On the other hand, in the case of the remote control communication, the output signal from the selector 17 is band-limited by the BPF 35, and thereafter is amplified by the amplifier 36. The amplified signal is detected by the detector 37. The detector 37 removes the carrier component from the modulated signal and extracts the data component. The output signal from the detector circuit 37 is wave-shaped in the wave shaping circuit 38 and transferred to the rear stage circuit. In the remote control communication, the converted electric signal is detected and wave-shaped. The resultant wave-shaped signal is transferred to the rear stage circuit.

Figure 4A:
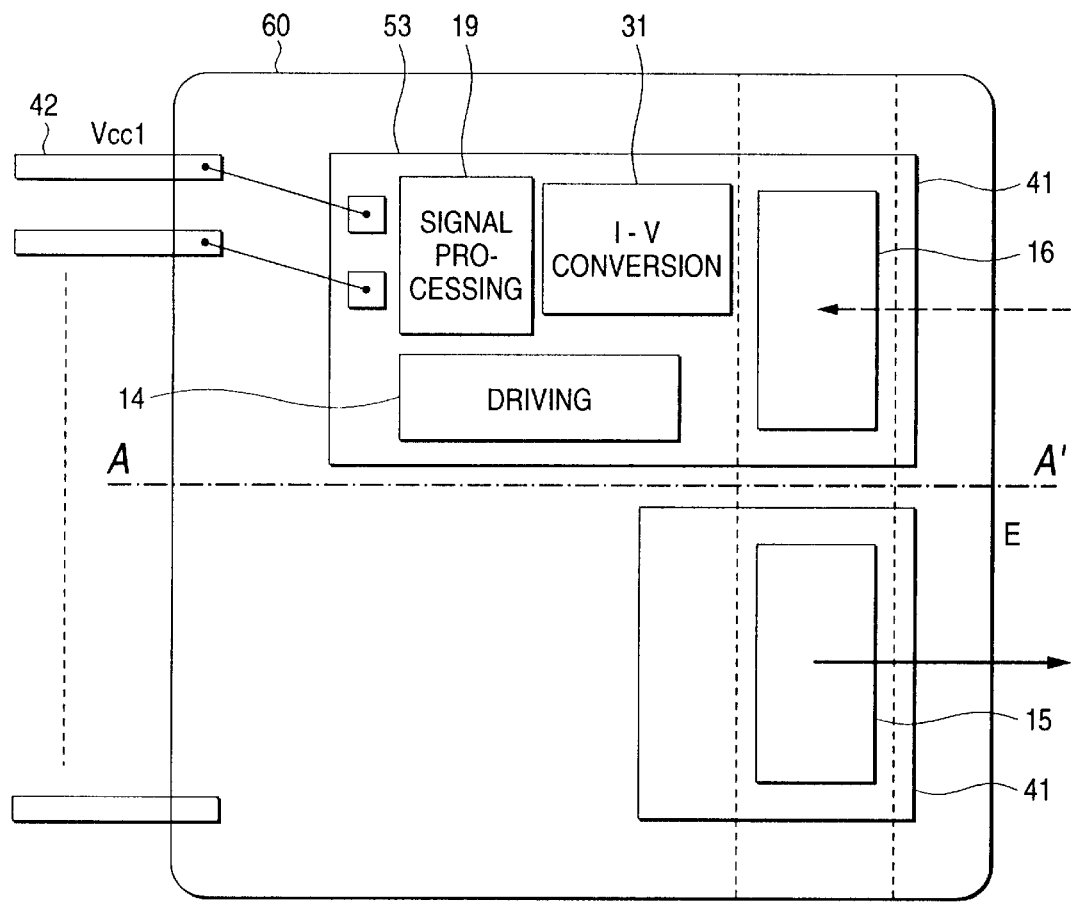
FIGS. 4A and 4B are a plan view and sectional view showing package for resin-sealing the circuit shown in FIG. 1, respectively.
Figure 4B:
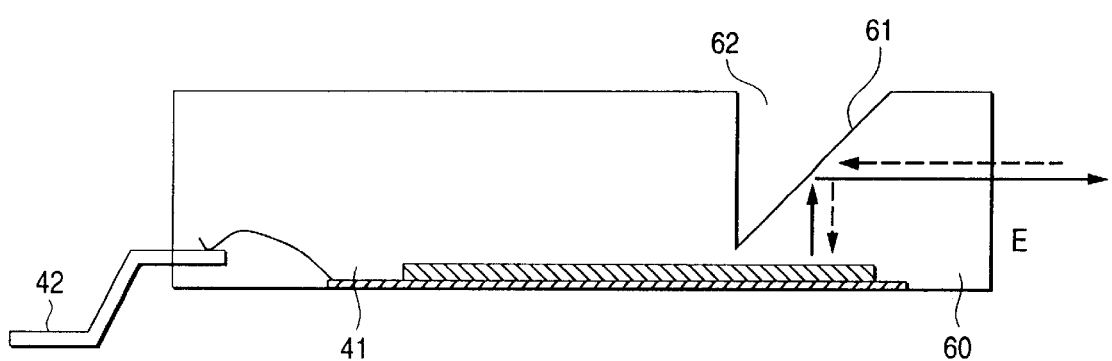
Figure 5:
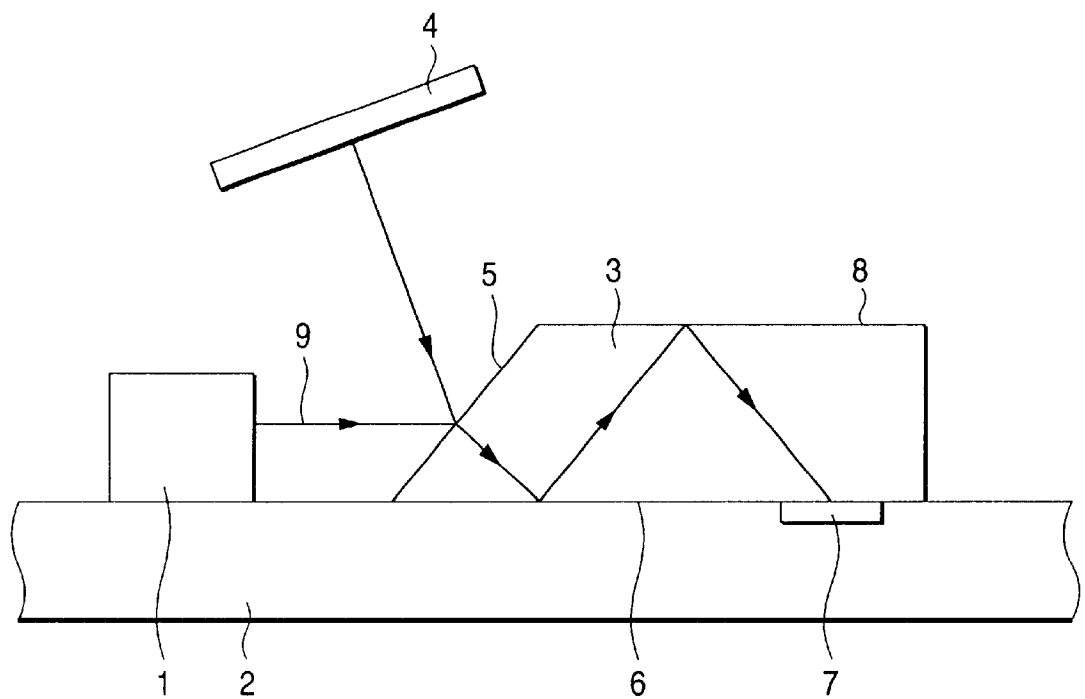
FIG. 5 is a sectional view of a prior art.
Figure 6:
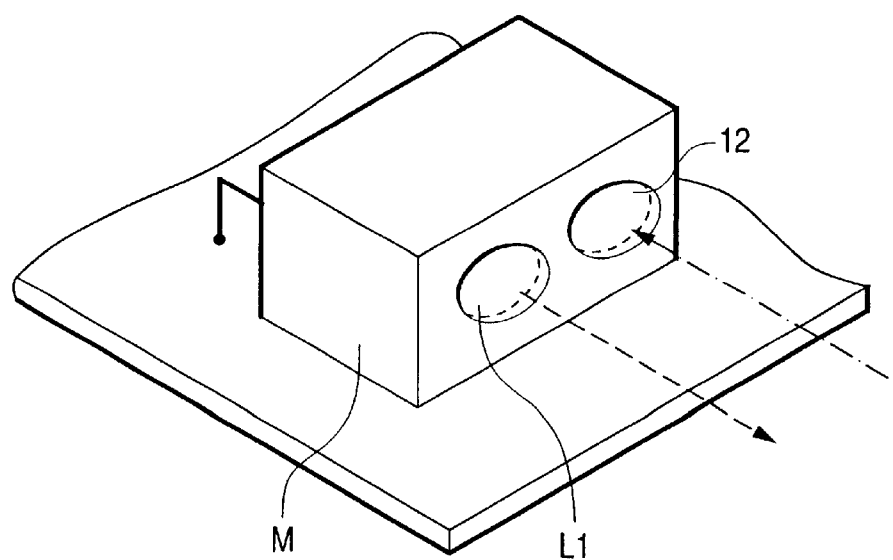
FIG. 6 is a perspective view of another prior art.

Referring to FIGS. 4A and 4B, an explanation will be given of a package for resin-sealing the circuit according to the present invention. For convenience of understanding, two figures are shown together. FIG. 4A is a plan view of the optical semiconductor device and FIG. 4B is a sectional view taken in line A–A' in the plan view.

As seen from FIGS. 4A and 4B, a lead frame is composed of islands 41 and leads 42 which are made of Cu. A first semiconductor chip 53 including the driving circuit 14, light receiving element 16 and signal processing circuits 18, 19 and mode exchanging circuit 20 and a second semiconductor chip 54 including the light emitting element 15 are fixed to the islands 41 by means of the fixing means such as solder.

Bonding pads (not shown) are formed on the semiconductor chips 53 and 54. Correspondingly, plural leads 42 are extended externally from the periphery of each of the semiconductor chips. The first and second semiconductor chips are connected to each other by a metallic wire (not shown).

The tips of the leads 41 and semiconductor chips are sealed by a resin sealing body 60 which is transparent to a prescribed waveform length. As seen from FIG. 4B, the sealing body 60 has a groove 62 having a face from which light reflects. The face 61 constitutes a reflecting face owing to a difference in the refractive index between air and resin on both sides of the boundary.

Incidentally, as seen from FIG. 4A, it should be noted that the driving circuit 14 for driving the light emitting element 15 (FIG.1) is included in the first semiconductor chip 53 which is a chip separate from the second semiconductor chip 54 including the light emitting element 15.

The circuit operation in the arrangement shown in FIGS. 4A and 4B will be explained below. When the light receiving element 16 (e.g. photodiode) formed in the first semiconductor chip is irradiated with light such as infrared rays, an output current flows from the light receiving element 16 and is converted into a voltage by the current/voltage converting circuit 31 formed in the first semiconductor chip 53. The output voltage is transferred, as a received signal, to the rear stage external circuit through the leads. On the other hand, when an input signal to be transmitted is applied to the driving circuit 14 formed on the semiconductor chip 53 through another lead 42, the driving circuit 14 generates a driving signal corresponding to the input signal. The driving signal is applied to the light emitting element 15 (e.g. LED) so that the light emitting element 15 is driven, thereby emitting e.g. light of infrared rays.

The light emitted from the upper face of the second semiconductor chip 54, as illustrated by solid line in FIG. 4B, goes upwards in the resin sealing body 60, is reflected at the face 61 and further goes rightwards so that the light is emitted from the side wall E of the resin sealing body 60. On the other hand, the light incident on the side E of the resin sealing body 60, as illustrated by dotted line, reflected at the face 61, goes downwards and received by the light receiving element 16 on the first semiconductor chip 53. Because of the presence of the face 61, the light is received by the first semiconductor chip 53 at the intensity when the light is incident. In this way, since the groove 62 providing the reflecting face 61 is formed on the first and the second semiconductor chip, light can be taken in or out from the side wall E of the resin sealing body 15.

In the present invention, the driving circuit 14 is integrated on the first semiconductor chip 53 which is separate from the second semiconductor chip 54 on which the light emitting element 15 is integrated. The light emitting element such as LED is generally made from IV-V compound semiconductor (e.g. GaAs). The circuit configuration including the driving circuit and current/voltage circuit is generally integrated on a Si substrate. Therefore, the driving circuit and the light emitting element 15 cannot be easily integrated on the same semiconductor substrate. However, in accordance with the present invention, since the driving circuit 14 is integrated on the first semiconductor chip 53, the circuits for light emission and light reception can be constructed by only two semiconductor chips, and the modules having light emission and light reception systems can be effectively housed in a single package.

Incidentally, the outer shape of the resin sealing body 60 should not be limited to that shown in FIGS. 4A and B. For example, the height of the side of the resin sealing body 60 on which the leads are formed may be different from that of the side for emission or incidence of light in such a manner that the side of emission or incidence of light provides a protrusion to form the reflecting face. In this case, the reflecting face 61 can be formed without forming the groove 62 in the resin sealing body 60.

In the present invention the first and second signal processing circuits are not necessary to comprise wave shaping circuits and may comprise signal processing means for processing an input signal to an output signal having 2 level signal.

The present invention is applicable to not only infrared ray but also another wave-length-rays.

Further the present invention is applicable to not only case having a first and a second communication format which are different from each other but also case having more than two communication format.

What is claimed is:

1. An optical semiconductor device, comprising:
    a first semiconductor chip including a light receiving element for receiving optical data in two different formats, first and second signal processing circuits for processing an output signal from said light receiving element, when input data in the first and second communication format is received, respectively, said light receiving element and said first and second signal processing circuits being integrated on the same semiconductor substrate:
    a resin sealing body which seals said first semiconductor chip with a light receiving face of said light receiving element oriented upward and is transparent to a prescribed wavelength of light; and
    a light reflecting face formed on said resin sealing body on said first semiconductor chip and crossing a normal line to a plane of a light receiving face at a prescribed angle, wherein a side wall of said resin sealing body serves as the light receiving face.

2. An optical semiconductor device according to claim 1, wherein said first signal processing circuit includes a signal transferring means for processing the output signal from said light receiving element and transferring a wave-shaped signal to a rear stage circuit.

3. An optical semiconductor device according to claim 1, wherein said second signal processing circuit includes a detecting means for detecting an output signal from.

4. An optical semiconductor device according to claim 1, wherein said first communication format is an Infrared Data Association standard communication and said second communication format is a remote control communication.

5. An optical semiconductor device according to claim 4, wherein said driving circuit is designed so that driving current is low in an Infrared Data Association standard communication and is high in a remote control communication.

6. An optical semiconductor device according to claim 1, further comprising:
    a light emitting element for emitting light having a prescribed wavelength to transmit data in said first and/or said second communication format; and
    a driving circuit for driving the light emitting element according to the data of said first or second communication format.

7. An optical semiconductor device according to claim 6, wherein said driving circuit is integrated in said first semiconductor chip.

8. An optical semiconductor device according to claim 1, further comprising:

a second semiconductor chip in which said light emitting element is integrated, said second semiconductor chip being integrally resin-sealed on said resin sealing body so that the said reflecting face crosses a normal line to a plane of said light emitting elent at a prescribed angle, wherein the sidewall of said resin sealing body serves as a light emitting face.

9. An optical semiconductor device, comprising:

a first semiconductor chip including a light receiving element for receiving optical data in two different formats, first and second signal processing circuits for processing an output signal from said light receiving element, when input data in the first and second communication format is received, respectively, and a driving circuit for driving a light emitting element, said said light receiving element, said first and second signal processing circuits, and said driving circuit being integrated on the same semiconductor substrate;

a second semiconductor chip in which the light emitting element is disposed;

a resin sealing body which seals said first and said second semiconductor chips with light receiving and emitting faces of the light receiving and light emitting elements, respectively, oriented upward and is transparent to a prescribed wavelength of light; and a light reflecting face formed on said resin sealing body and crossing a normal line to a plane of said light receiving and emitting faces at a prescribed angle, wherein a side wall of said resin scaling body serves as the light receiving or emitting face.

10. An optical semiconductor device according to claim 9, wherein said first and said second semiconductor chips are integrally sealed within said resin sealing body.

11. An optical semiconductor device according to claim 9, wherein said first and said second semiconductor chips are sealed in a first and a second resin sealing body, respectively.

12. An optical semiconductor device according to claim 9, wherein said signal processing circuit is a current/voltage converting circuit for converting an output current from said light receiving element into a voltage.

* * * * *